US008769477B1

(12) United States Patent
Gathoo et al.

(10) Patent No.: US 8,769,477 B1
(45) Date of Patent: Jul. 1, 2014

(54) COMPUTER AIDED DESIGN TOOL AND USER INTERFACE FOR CONFIGURATION OF A PROGRAMMABLE SYSTEM-ON-A-CHIP

(71) Applicant: Xilinx, Inc., San Jose, CA (US)

(72) Inventors: Yogesh Gathoo, Maharashtra (IN); Siddharth Rele, Maharashtra (IN); Gregory A. Brown, Colorado Springs, CO (US); Avdhesh Palliwal, Hyderabad (IN); Gangadhar Budde, Hyderabad (IN); Sumit Nagpal, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/756,339

(22) Filed: Jan. 31, 2013

(51) Int. Cl.
*G06F 17/50* (2006.01)
(52) U.S. Cl.
USPC ........... 716/139; 716/102; 716/116; 716/117; 716/138
(58) Field of Classification Search
USPC .......................... 716/102, 138, 139, 116, 117
See application file for complete search history.

(56) References Cited

U.S. PATENT DOCUMENTS

| 7,404,645 | B2 * | 7/2008 | Margulis | 353/31 |
| 7,849,449 | B2 * | 12/2010 | Andrade et al. | 717/127 |
| 7,945,894 | B2 * | 5/2011 | Peck et al. | 717/109 |
| 8,002,188 | B2 * | 8/2011 | Wang | 235/462.45 |

OTHER PUBLICATIONS

"Zynq-7000 EPP Software Developers Guide," Xilinx, Inc., Doc. UG821 v2.0, Apr. 24, 2012, 39 pgs., Xilinx, Inc., 2100 Logic Drive, San Jose, CA US.
"Zynq-7000 All Programmable SoC: Concepts, Tools, and Techniques (CTT), A Hands-On Guide to Effective Embedded System Design," Xilinx, Inc., Doc. UG873 v14.1, May 31, 2012, 50 pgs., Xilinx, Inc., 2100 Logic Drive, San Jose, CA US.
Rajagopalan, V. et al., "Xilinx Zynq-7000 EPP, An Extensible Processing Platform Family," Xilinx, Inc., Aug. 18, 2011, 24 pgs., Xilinx, Inc., 2100 Logic Drive, San Jose, CA US.

* cited by examiner

*Primary Examiner* — Sun Lin
(74) *Attorney, Agent, or Firm* — Kevin T. Cuenot

(57) ABSTRACT

A user interface for a computer-aided design tool includes a display. The display includes a visualization of a processor system of a system-on-a-chip (SOC). The visualization includes a plurality of blocks and each block represents a component of the processor system. Each block visually indicates a configuration status of the component represented by the block.

20 Claims, 9 Drawing Sheets

☑ Enable DDR Controller

DDR Controller Configuration

| | |
|---|---|
| Memory Type | DDR3 ▶ |
| Memory Part | Custom ▶ |
| Effective DRAM Bus Width | 32 Bit ▶ |
| EOC | Enabled |
| Burst Length | 8 |
| Operating Frequency (MHz) | 533.333313 |
| Internal Vref | ☐ |
| Operating Temperature (C) | Normal ▶ |

Training Board Detail

DRAM Training
☐ Write Leveling ☐ Read Gate ☐ Read Data Eye

DQS to Clock Delay (ns)

| DQS3 | DQS2 | DQS1 | DQS0 |
|---|---|---|---|
| ◀ 0.000 ▶ | ◀ 0.000 ▶ | ◀ 0.000 ▶ | ◀ 0.000 ▶ |

Board Delay (ns)

| DQ[31:24] | DQ[23:16] | DQ[15:8] | DQ[7:0] |
|---|---|---|---|
| ◀ 0.000 ▶ | ◀ 0.000 ▶ | ◀ 0.000 ▶ | ◀ 0.000 ▶ |

Memory Port Configuration

| | |
|---|---|
| DRAM IC Bus Width | 8 Bits ▶ |
| DRAM Device Capability | 2048 MBits ▶ |
| Speed | DDR3 ▶ |
| Bank Address Count (bits) | ◀ 3 ▶ |
| Row Address Count (bits) | ◀ 15 ▶ |
| Col Address Count (bits) | ◀ 10 ▶ |
| CAS Latency (cycles) | ◀ 7 ▶ |
| CAS Write Latency (cycles) | ◀ 5 ▶ |
| RAS to CAS delay (cycles) | ◀ 7 ▶ |
| Precharge Time (cycles) | ◀ 7 ▶ |
| tRC (ns) | ◀ 40.91 ▶ |
| RAS min (ns) | ◀ 34.00 ▶ |
| FAW (ns) | ◀ 25.00 ▶ |

Additive Latency (ns) ◀ 0 ▶

[ OK ] [ Cancel ] [ Help ]

Processor Configuration ← 805

| Enable | Peripheral | IO | |
|---|---|---|---|
| ☐ | Quad SPI Flash | <Select> | ▷ |
| ☐ | SRAM/NOR Flash | <Select> | ▷ |
| ☐ | NAND Flash | <Select> | ▷ |
| ☐ | Enet 0 | <Select> | ▷ |
| ☐ | Enet 1 | <Select> | ▷ |
| ☐ | USB 0 | <Select> | ▷ |
| ☐ | USB 1 | <Select> | ▷ |
| ☐ | SD0 | <Select> | ▷ |
| ☐ | SD1 | <Select> | ▷ |
| ☐ | UART 0 | <Select> | ▷ |
| ☐ | UART 1 | <Select> | ▷ |
| ☐ | L2C 0 | <Select> | ▷ |
| ☐ | L2C 1 | <Select> | ▷ |
| ☐ | SPI 0 | <Select> | ▷ |
| ☐ | SPI 1 | <Select> | ▷ |
| ☐ | CAN 0 | <Select> | ▷ |
| ☐ | CAN 1 | <Select> | ▷ |
| ☐ | Trace | <Select> | ▷ |
| ☐ | Timer 0 | <Select> | ▷ |
| ☐ | Timer 1 | <Select> | ▷ |
| ☐ | Watchdog | <Select> | ▷ |
| ☐ | PJTAG | <Select> | ▷ |
| ☑ | GPIO | MIO | ▶ |

MIO Configuration ← 810

| IO | Peripheral | Signal | IO Type | Pullup | Direction |
|---|---|---|---|---|---|
| MIO 0 | SRAM/NOR Flash | HSTL | <select> | <select> | ▶ |
| MIO 0 | SRAM/NOR Flash | HSTL | <select> | <select> | ▶ |
| MIO 0 | SRAM/NOR Flash | HSTL | <select> | <select> | ▶ |
| MIO 0 | SRAM/NOR Flash | HSTL | <select> | <select> | ▶ |
| MIO 0 | SRAM/NOR Flash | HSTL | <select> | <select> | ▶ |
| MIO 0 | SRAM/NOR Flash | HSTL | <select> | <select> | ▶ |
| MIO 0 | SRAM/NOR Flash | HSTL | <select> | <select> | ▶ |

| Crystal | Processing_system7_0 ▶ | | Clock Ratio | Processing_system7_0 ▶ | |
|---|---|---|---|---|---|
| Component | Clock Source | | Requested Frequency (MHz) | Actual Frequency (MHz) | Range (MHz) |
| ⊞ Processor/Memory Clocks | | | | | |
| ⋮ CPU | CPU PLL | ▶ | 666.666666 | 666.666667 | 50.00 : 667.00 |
| ⋮ DDR | DDR PLL | | 533.333333 | 533.333374 | 200.00 : 533.33 |
| ⊞ IO Peripheral Clocks | | | | | |
| ⋮ CPU | CPU PLL | ▶ | 666.666666 | 666.666667 | 50.00 : 667.00 |
| ⋮ CPU | CPU PLL | ▶ | 666.666666 | 666.666667 | 50.00 : 667.00 |
| ⋮ CPU | CPU PLL | ▶ | 666.666666 | 666.666667 | 50.00 : 667.00 |
| ⋮ CPU | CPU PLL | ▶ | 666.666666 | 666.666667 | 50.00 : 667.00 |

COMPUTER AIDED DESIGN TOOL AND USER INTERFACE FOR CONFIGURATION OF A PROGRAMMABLE SYSTEM-ON-A-CHIP

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This specification relates to a computer-aided design tool and user interface for configuring a programmable system-on-a-chip (SOC) implemented as an integrated circuit.

BACKGROUND

Integrated circuits (ICs) can be implemented to perform a variety of functions. Some ICs can be programmed to perform specified functions. One example of an IC that can be programmed is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

A system-on-a-chip (SOC) refers to a semiconductor IC that includes two different regions connected together so that each region can communicate and operate cooperatively with the other. The first region is a processor system. The processor system is built around a central processing unit (CPU) architecture and, as such, can include memory, peripherals, switches, busses, and configurable input and/or output ports. The second region includes programmable circuitry. The programmable circuitry can be implemented as an FPGA or using one or more of the other programmable circuit structures noted above.

SUMMARY

A user interface for a computer-aided design tool includes a display. The display includes a visualization of a processor system of a system-on-a-chip (SOC). The visualization includes a plurality of blocks and each block represents a component of the processor system. Each block visually indicates a configuration status of the component represented by the block.

A method of computer-aided design includes displaying, upon a display, a visualization of a processor system of an SOC. The visualization includes a plurality of blocks and each block represents a component of the processor system. The method includes receiving a user input specifying a configuration parameter for a block selected from the plurality of blocks and visually indicating, using a processor, a configuration status of the block responsive to the user input.

A non-transitory computer-readable storage medium includes instructions which, when executed by a processor, perform a method. The method includes displaying, upon a display, a visualization of a processor system of an SOC. The visualization includes a plurality of blocks and each block represents a component of the processor system. The method further includes receiving a user input specifying a configuration parameter for a block selected from the plurality of blocks and visually indicating a configuration status of the block responsive to the user input.

BRIEF DESCRIPTION OF THE DRAWINGS

FIG. 5 is a fifth block diagram illustrating another example of a view for the UI.

FIG. 8 is an eighth block diagram illustrating another example of a view for the UI.

FIG. 9 is a ninth block diagram illustrating another example of a view for the UI.

DETAILED DESCRIPTION OF THE DRAWINGS

While the specification concludes with claims defining novel features, it is believed that the various features disclosed within this specification will be better understood from a consideration of the description in conjunction with the drawings. The process(es), machine(s), manufacture(s) and any variations thereof described within this specification are provided for purposes of illustration. Specific structural and functional details disclosed within this specification are not to be interpreted as limiting, but merely as a basis for the claims and as a representative basis for teaching one skilled in the art to variously employ the features described in virtually any appropriately detailed structure. Further, the terms and phrases used within this specification are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

This specification relates to configuration of a programmable system-on-a-chip (SOC) implemented as an integrated circuit (IC). In accordance with the inventive arrangements disclosed within this specification, a computer-aided design (CAD) tool is provided through which a user can configure an SOC. The CAD tool provides a user interface (UI) that graphically represents the architecture of a processor system portion of the SOC. The UI further graphically represents input/output (I/O) blocks of the SOC in combination, and concurrently, with one or more blocks of the processor system. Accordingly, a user accessing the CAD tool is provided with a unified, graphical view through which the SOC can be configured. By configuring the SOC in the manner described, design rule checks can be applied in a more responsive manner, e.g., in real time, as opposed to after compilation or as a post-processing step as is the case with conventional techniques for configuring such an SOC.

The term "user" means a human being unless otherwise stated. The phrase "real time" means a level of processing responsiveness that a user or system senses as sufficiently immediate for a particular process or determination to be made, or that enables the processor to keep up with some external process.

Figure 1:
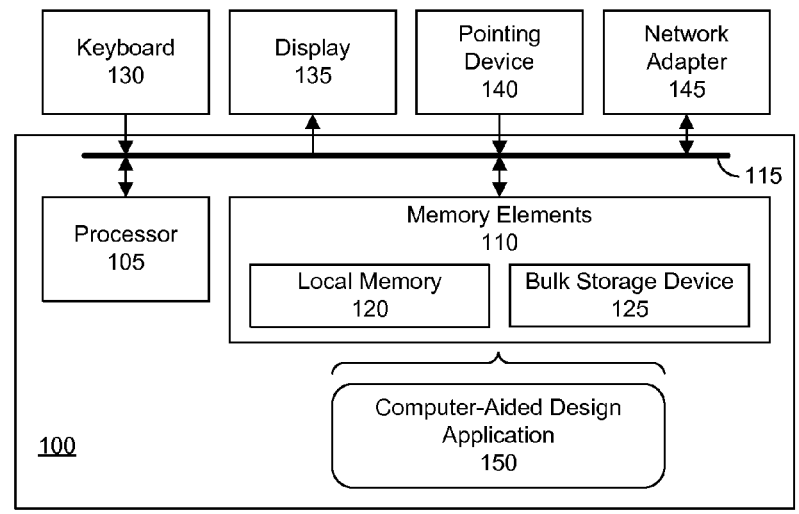
FIG. 1 is a first block diagram illustrating an exemplary data processing system.

FIG. 1 is a first block diagram illustrating an exemplary data processing system (system) 100. System 100 includes at least one processor, e.g., a central processing unit (CPU), 105 coupled to memory elements 110 through a system bus 115 or other suitable circuitry. System 100 can store program code within memory elements 110. Processor 105 executes the program code accessed from memory elements 110 via system bus 115. In one aspect, system 100 is implemented as a computer that is suitable for storing and/or executing program code. It should be appreciated, however, that system 100 can be implemented in the form of any system including a processor and memory that is capable of performing the functions described within this specification.

Memory elements 110 include one or more physical memory devices such as, for example, local memory 120 and one or more bulk storage devices 125. Local memory 120 refers to random access memory (RAM) or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device 140 optionally can be coupled to system 100. The I/O devices can be coupled to system 100 either directly or through intervening I/O controllers. A network adapter 145 also can be coupled to system 100 to enable system 100 to become coupled to other systems, computer systems, remote printers, and/or remote storage devices through intervening private or public networks. Modems, cable modems, and Ethernet cards are examples of different types of network adapter 145 that can be used with system 100.

Memory elements 110 store a CAD application 150 and an operating system (not shown). CAD application 150, being implemented in the form of executable program code, is executed by system 100 and, as such, is an integrated part of system 100. CAD application 150 is a functional data structure that imparts functionality when employed as part of system 100 and/or a suitable SOC. Further, the various items operated upon by CAD application 150, e.g., programmatically specified circuit designs and/or parameters of circuit designs specified or formatted using a hardware description language, a netlist, or the like, also are functional data structures that impart functionality when used with system 100 and/or an SOC.

Accordingly, system 100, with CAD application 150 stored and/or executing therein, forms a CAD tool. System 100 provides a UI through which a user is able to specify, at least in part, a design to be implemented by an SOC. The SOC is an IC in which the design is to be implemented. The SOC includes a first region and a second region connected to the first region. The first region is a processor system. The second region includes or is formed entirely of programmable circuitry.

A "UI" means a mechanism through which a CAD tool such as system 100 receives user input specifying configuration data that defines a design to be implemented within an SOC. The user inputs can be specified using any of a variety of devices supporting different modalities. For example, tactile input devices such as pointing devices, keyboards, touchscreen displays, etc. can receive user input. Devices such as microphones can receive user input in the form of audio or speech.

In one example, the UI is generated to include one or more views or windows displayed upon display 135. The UI, e.g., within a view or a window, includes a graphical representation of at least a portion of the SOC. The graphical representation, also referred to as a visualization, is dynamic in that one or more portions of the graphical representation are updated in real time responsive to received user input(s) to visually indicate a particular state of the SOC or portion thereof at any given time.

Figure 2:
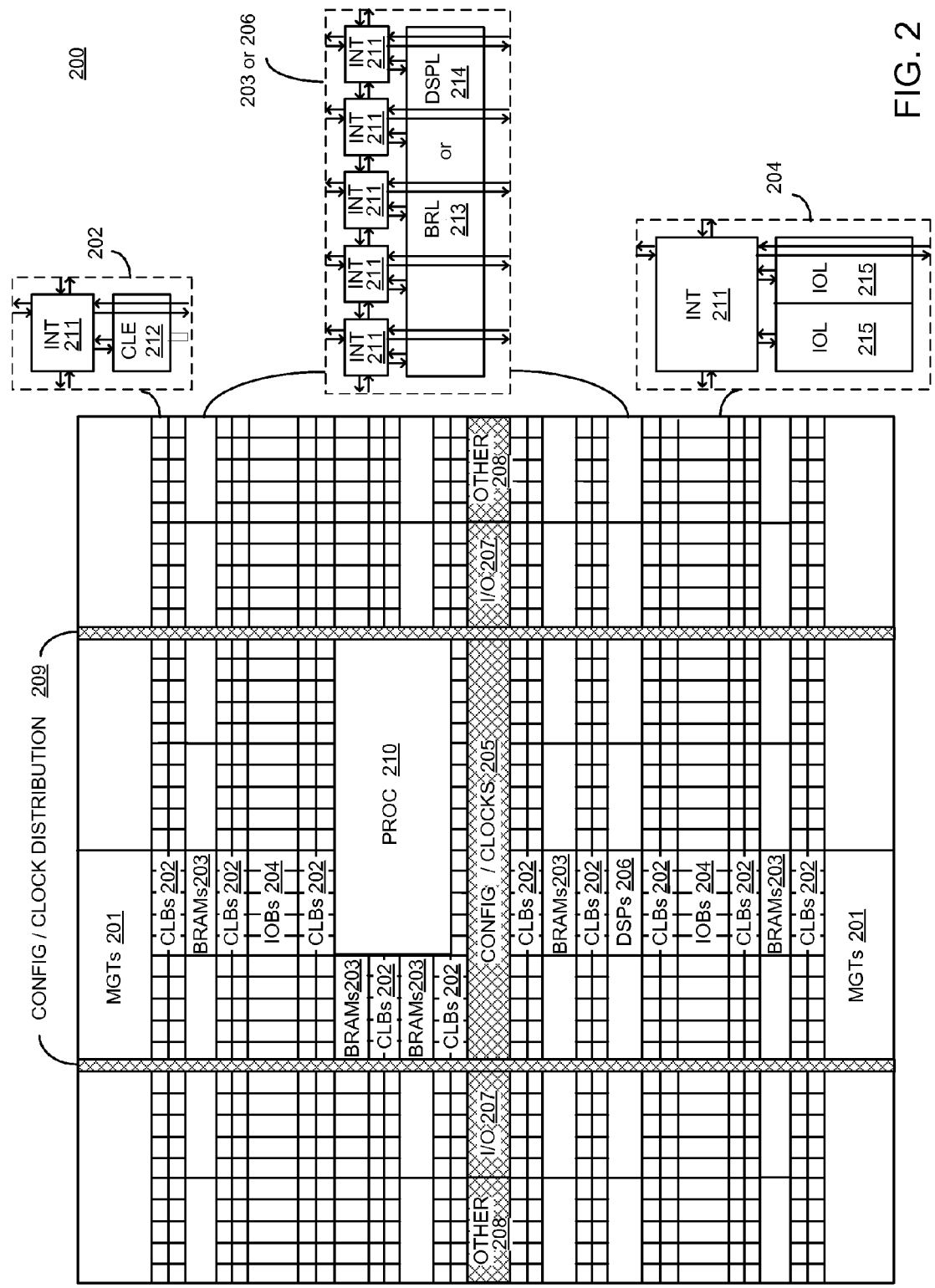
FIG. 2 is a second block diagram illustrating an exemplary architecture for a system-on-a-chip (SOC) implemented as an integrated circuit

FIG. 2 is a second block diagram illustrating an exemplary architecture 200 for an SOC implemented as an IC. Architecture 200 can be implemented as, for example, a field programmable gate array (FPGA) having a processor or as another IC including programmable circuitry connected to a processor system.

As shown, architecture 200 includes several different types of programmable circuit, e.g., logic, blocks that form the programmable circuitry. For example, architecture 200 can include a large number of different programmable tiles including multi-gigabit transceivers (MGTs) 201, configurable logic blocks (CLBs) 202, RAM blocks (BRAMs) 203, input/output blocks (IOBs) 204, configuration and clocking logic (CONFIG/CLOCKS) 205, digital signal processing blocks (DSPs) 206, specialized I/O blocks 207 (e.g., configuration ports and clock ports), and other programmable logic 208 such as digital clock managers, analog-to-digital converters, system monitoring logic, and so forth.

In some ICs, each programmable tile includes a programmable interconnect element (INT) 211 having standardized connections to and from a corresponding INT 211 in each adjacent tile. Therefore, the INTs 211, taken together, implement the programmable interconnect structure for the illustrated IC. Each INT 211 also includes the connections to and from the programmable logic element within the same tile, as shown by the examples included at the top of FIG. 2.

For example, a CLB 202 can include a configurable logic element (CLE) 212 that can be programmed to implement user logic plus a single INT 211. A BRAM 203 can include a BRAM logic element (BRL) 213 in addition to one or more INTs 211. Typically, the number of INTs 211 included in a tile depends on the height of the tile. In the pictured embodiment, a BRAM tile has the same height as five CLBs, but other numbers (e.g., four) can also be used. A DSP tile 206 can include a DSP logic element (DSPL) 214 in addition to an appropriate number of INTs 211. An IOB 204 can include, for example, two instances of an I/O logic element (IOL) 215 in addition to one instance of an INT 211. As will be clear to those of skill in the art, the actual I/O pads connected, for example, to IOL 215 typically are not confined to the area of IOL 215.

In the example pictured in FIG. 2, a columnar area near the center of the die, e.g., formed of regions 205, 207, and 208, can be used for configuration, clock, and other control logic. Horizontal areas 209 extending from this column are used to distribute the clocks and configuration signals across the breadth of the programmable IC.

Some ICs utilizing the architecture illustrated in FIG. 2 include additional logic blocks that disrupt the regular columnar structure making up a large part of the IC. The additional logic blocks can be programmable blocks and/or dedicated circuitry. For example, a processor block depicted as PROC 210 spans several columns of CLBs and BRAMs.

In one aspect, PROC 210 is implemented as dedicated circuitry, e.g., as a hard-wired processor, that is fabricated as part of the die that implements the programmable circuitry of the IC. PROC 210 can represent any of a variety of different processor types and/or processor systems ranging in complexity from an individual processor, e.g., a single core capable of executing program code, to an entire processor system having one or more cores, modules, co-processors, interfaces, or the like.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 2 that are external to PROC 210 such as CLBs 203 and BRAMs 203 can be considered programmable circuitry of the IC.

In general, the functionality of programmable circuitry is not established until configuration data is loaded into the IC. A set of configuration bits is used to program programmable circuitry of an IC. The configuration bit(s) typically are referred to as a "configuration bitstream." In general, programmable circuitry is not operational or functional without first loading a configuration bitstream into the IC. The configuration bitstream programs the programmable circuitry to implement, e.g., instantiate, a particular circuit design therein. The resulting physical circuitry from a bitstream differs from the physical circuitry formed from loading another, different bitstream. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 210.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry, e.g., PROC 210, is not considered programmable circuitry as the hardwired circuitry is operable and has a particular function when manufactured as part of the IC.

Architecture 200 is one example that can be used to implement an SOC. The number of logic blocks in a column, the relative width of the columns, the number and order of columns, the types of logic blocks included in the columns, the relative sizes of the logic blocks, and the interconnect/logic implementations included at the top of FIG. 2 are purely exemplary. In an actual SOC implementation, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 110 within the IC are for purposes of illustration only and are not intended as a limitation.

In illustration, the processor system of the IC and the programmable circuitry of the SOC can be positioned differently than illustrated in FIG. 2. For example, rather than comingling the processor system, e.g., PROC 210, within the programmable circuitry, the processor system can occupy the entirety of a plurality of rows (e.g., an entire horizontal top portion, an entire horizontal mid portion, or an entire horizontal bottom portion of the IC). In another example, the processor system can occupy the entirety of a plurality of columns (e.g., an entire vertical left portion, an entire vertical center portion, or an entire vertical right portion of the IC).

Figure 3:
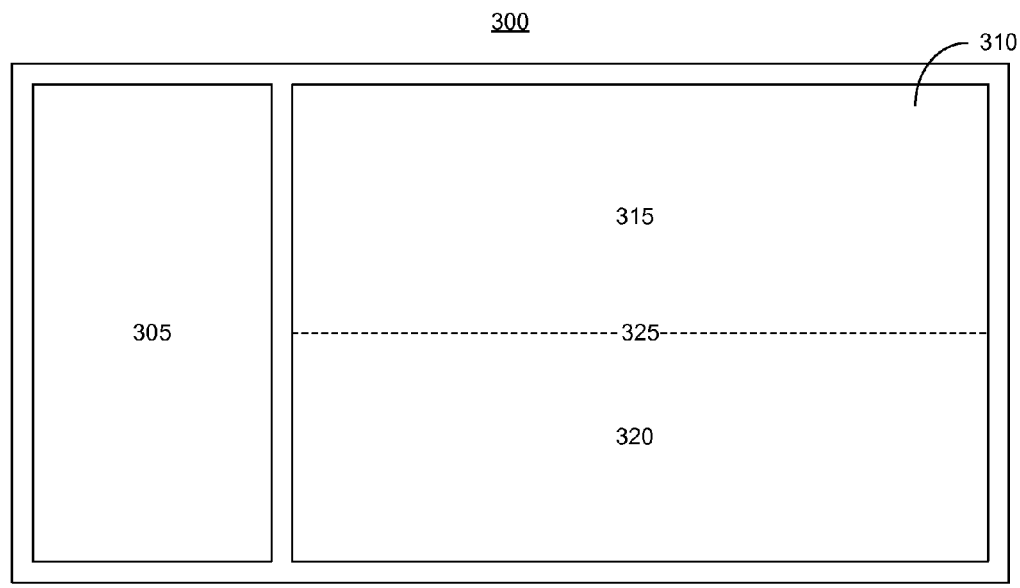
FIG. 3 is a third block diagram illustrating an example of view of a user interface (UI) generated by the system of FIG. 1.

FIG. 3 is a third block diagram illustrating an example of view 300 of a UI generated by system 100 of FIG. 1. View 300 is generated by system 100 and displayed upon display 135. As pictured, view 300 includes regions 305 and 310. In the example shown in FIG. 3, region 310 is subdivided by dividing line 325 into two regions (e.g., sub-regions) 315 and 320. Region 305 is provided as an intellectual property (IP) library. Region 310 is a working area in which the processor system and the programmable circuitry regions of the SOC are represented. Within region 315, a visualization of the processor system is displayed as an interactive portion of view 300.

Region 320 represents the programmable circuitry region of the SOC and can display a visualization of circuitry, e.g., user-specified circuitry, implemented therein. For example, region 320 can display a visualization of at least a portion of the programmable circuitry of the SOC that is implemented as an FPGA described for purposes of illustration with reference to FIG. 2. In this regard, the SOC represented by FIG. 3 includes a processor system coupled, or connected, to an FPGA or one or more programmable circuit blocks of an FPGA as previously described. Region 320, and any visualization contained therein, can be displayed concurrently with any visualization of the processor system of the SOC.

Within region 305, one or more IP cores available within system 100 are displayed and available for use within a user specified design for the SOC. Different ones of the IP cores available through region 305 can be selected by a user input and placed, for example, within region 320. Placement of an IP core within region 320 adds the IP core to the circuit design begin created for the SOC using system 100. Like region 315, region 320 can be configured as an interactive portion of view 300.

Figure 4:
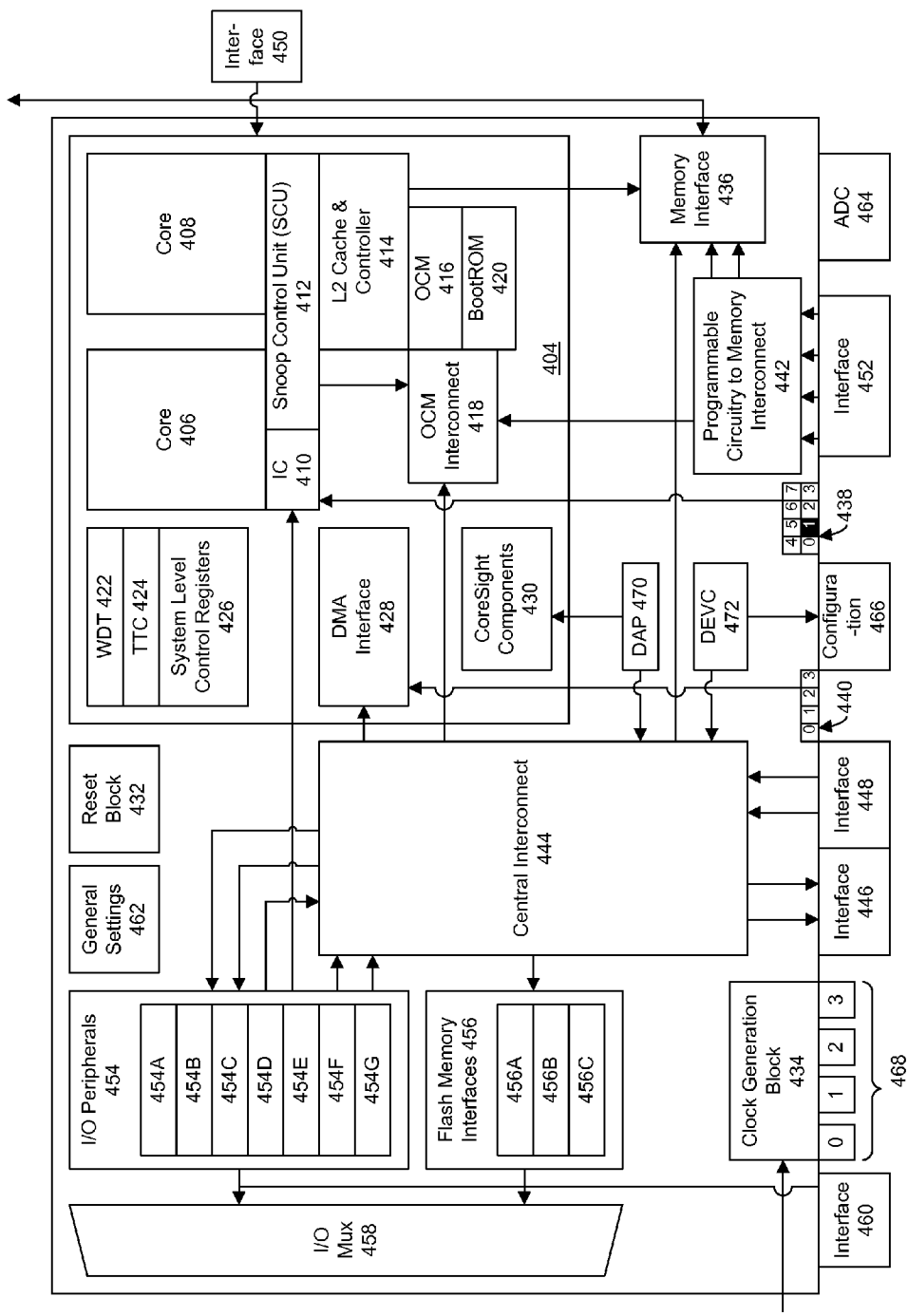
FIG. 4 is a fourth block diagram illustrating an exemplary visualization of the processor system of an SOC.

FIG. 4 is a fourth block diagram illustrating an exemplary visualization 402 of the processor system of the SOC. In one example, visualization 402 is displayed within region 315 of view 300 or as part of another view and/or UI. In another example, visualization 402 can be presented in isolation as a standalone view of a UI.

As shown, visualization 402 includes a plurality of blocks. Each block represents a component, e.g., a circuit block, of the processor system of an SOC. In one aspect, visualization 402 corresponds to, or matches, the visual depiction of the processor system of the SOC that is provided within user documentation for the SOC. By matching visualization 402 with the user documentation, users are better able to understand the implications of configuration decisions.

The processor system of the SOC, as represented by visualization 402, is a hard-wired system. As discussed, one or more components of the processor system, as represented in visualization 402, are configurable. A block is configured by assigning values to configuration parameters for the block. The configuration parameters are translated, by system 100, for example, into configuration data such as a bitstream, or portion thereof, that is used to program the actual SOC.

Within visualization 402, to the extent that various blocks are connected by lines representing signals or communication links, arrows on the lines are intended to illustrate the direction or flow of control. In this regard, a signal illustrated as a line with a directional arrow indicates that control over the signal is exerted by the source block from which the arrow emanates rather than the target block to which the arrow points. The arrows are not intended to indicate one-way flow of data or directionality of the signal. Signals can be implemented as bi-directional signals or communication links despite the presence of the directional arrow.

For purposes of discussion, the following description assigns a name to each block. The name of a block is the same as the name for the actual component of the processor system that is represented by the block. Though referenced by the same name as the represented component, it should be appreciated that the blocks shown in FIG. 4 form a part of a UI. Each block of the UI is described as hardware in order to better illustrate the configuration parameters available to the user through system 100 for the block and, correspondingly, for the underlying component. As such, one or more or all of the various blocks described are interactive. The appearance of the respective blocks is changed responsive to received user inputs that provide values for configuration parameters for the block and/or for other blocks of the processor system of the SOC.

As pictured, visualization 402 includes a central processing unit (CPU) 404. CPU 404 includes cores 406 and 408. Though not shown, each of cores 406 and 408 includes a memory management unit (MMU) and a level 1 cache. In another aspect, the MMU and level 1 cache of each respective core can be shown as part of visualization 402. Any of a variety of different types of processor cores capable of executing program code can be used. In one example, cores 406 and 408 each can be implemented as an ARM Cortex™-A9 type of processor core each having a 32 KB instruction cache and a 32 KB data cache. The ARM Cortex™-A9 processor cores are available from ARM Holdings of Cambridge, UK (ARM). While illustrated as a multi-core, e.g., a dual-core, system, in another example, CPU 404 includes a single core that executes program code. In another example, CPU 404 includes more than two cores.

CPU 404 further includes an interrupt controller (shown in FIG. 4 as "IC") 410, a snoop control unit (SCU) 412, a level 2 cache and controller (hereafter collectively referred to as "L2 cache") 414, an on-chip memory (OCM) 416, an OCM interconnect 418, and a boot read-only memory (ROM) 420. Cores 406 and 408 can directly access L2 cache 414 and OCM 416. In general, OCM 416 provides local memory that is available to the processor system and/or to programmable circuitry (not shown), e.g., user-specified circuits implemented within programmable circuitry of the SOC. By comparison, L2 cache 414, which is also a memory, functions as a cache for the processor system. Accordingly, L2 cache 414 can store small portions of data, e.g., 256 bits, which are effectively copies of data bits stored in RAM, e.g., execution memory off-chip. If, for example, a read request is issued for data stored in L2 cache 414, the data can be read from L2 cache 414 as opposed to being retrieved from the RAM.

Interrupt controller 410 is connected to I/O peripherals 454 and to the programmable circuitry. Interrupt indicators 438, unlike other blocks within visualization 402, do not represent underlying components of the processor system. Interrupt indicators 438 indicate which of the interrupts is in use or assigned. Interrupt indicators 438 include one indicator for each interrupt that is available to the programmable circuitry. As shown, each available interrupt can be numbered independently and is independently selectable and configurable. In the example pictured in FIG. 4, interrupt 1 has been configured for use by circuitry within the programmable circuitry. As such, the interrupt indicator for interrupt 1 is visually distinguished from the interrupt indicators for interrupts 0, 2, 3, 4, 5, 6, and 7, which are not in use or assigned to circuitry. It should be appreciated that the particular number of interrupts shown is not intended as a limitation. Fewer or additional interrupts can be provided with each such interrupt having a corresponding one of the interrupt indicators 438.

CPU 404 further includes a watchdog timer (WDT) 422, a triple timer counter (TTC) 424, system level control registers 426 to be described herein in further detail, a direct memory access (DMA) interface 428, and CoreSight™ Components 430. CoreSight™ Components 430 are components that provide multi-core debug and trace functions with high bandwidth for the PS including trace and monitor of the system bus. CoreSight™ Components 430 are available from ARM.

DMA interface 428, in general, is used to push data to, and/or pull data from memory. DMA interface 428 is used, for example, to connect memory and Peripheral Component Interconnect (PCI) express to the processor system. As shown, DMA interface 428 is connected to the programmable circuitry. DMA indicators 440, like interrupt indicators 438, do not represent underlying components of the processor system. DMA indictors 440 indicate which of the DMA channels is in use or assigned. DMA indicators 440 include one indicator for each channel of DMA interface 428. As shown, each can be numbered independently and is independently selectable and configurable.

DMA interface 428 is connected to central interconnect 444 and to the programmable circuitry. In the example pictured in FIG. 4, DMA channel 0 has been configured for use by circuitry within the programmable circuitry. As such, the DMA indicator for DMA channel 0 is visually distinguished from the DMA indicator for DMA channels 1, 2, and 3, which are not in use or assigned to circuitry. It should be appreciated that the particular number of DMA channels shown is not intended as a limitation. Fewer or additional DMA channels can be provided with each such DMA channel having a corresponding one of the DMA indicators 440.

Visualization 402 of the processor system further includes a reset block 432, a clock generation block 434, and a memory interface 436. Reset block 432 can receive one or more signals originating from a source external to the SOC. Reset block 432 controls resetting of one or more or all of the components within the processor system. Reset block 432 further can receive signals requesting powering on or off of the programmable circuitry.

Clock generation block 436 can receive one or more reference signals from a source external to the SOC. Clock generation block 436, for example, can be implemented as, or include, phase-lock loop circuitry capable of synchronizing to a received reference signal. Clock generation block 436 can generate one or more clock signals, e.g., four in this example as illustrated by ports 468, individually shown as ports 0, 1, 2, and 3, to the programmable circuitry of the SOC. Through ports 0-3, clock generation block 434 generates and distributes one or more clock signals of one or more different frequencies to the programmable circuitry for use by circuits implemented therein. The appearance of ports 0-3 can be updated to indicate whether the particular port is being used (providing a clock signal).

Memory interface 436 can be implemented to communicate with one or more different types of RAMs located external to the SOC, e.g., "off-chip." Memory interface 436 can include a switch through which circuits implemented within the programmable circuitry can access OCM 416 and one or more external memories. In another aspect, memory interface 436 includes a memory controller. As such, memory interface 436 is configurable to communicate (e.g., read and/or write) with a variety of different memory types including, but not limited to, Dual Data Rate (DDR) 2, DDR3, Low Power (LP) DDR2 types of memory, whether 16-bit, 32-bit, 16-bit with ECC, etc. The list of different memory types with which memory interface 436 is able to communicate is provided for purposes of illustration only and is not intended as a limitation or to be exhaustive.

Programmable circuitry-to-memory interconnect (PCMC) 442 establishes connections between OCM interconnect 418 and interface 452. PCMC 442 further establishes connections between interface 452 and memory interface 436. As pictured, OCM interconnect 418 is configurable to establish connections between central interconnect 444 and OCM 416 and to establish connections between PCMC 442 and OCM 416.

Central interconnect 444 routes signals among various components of the processor system as shown. Central interconnect 444, for example, is configurable to route signals among flash memory interfaces 456, I/O peripherals 454, interface 446, interface 448, memory interface 436, OCM interconnect 418, and DMA channel 428.

The processor system includes a plurality of different hardware resources. The processor system includes a plurality of I/O peripherals 454 and a plurality of flash memory interfaces 456. I/O peripherals 454 include various types of peripherals shown as peripherals 454A-454G. For example, one or more of peripherals 454A-454G can be implemented as a Universal Serial Bus (USB) device, a gigabit Ethernet device, a Secure Digital (SD) device, a General Purpose I/O (GPIO) device, Universal Asynchronous Receiver/Transmitter (UART) device, a Serial Peripheral Interface (SPI) bus device, a Controller-Area-Network (CAN) device, an $I^2C$ device, or the like.

Flash memory interfaces 456 include one or more flash memory interfaces illustrated as 456A-456C. For example, one or more of flash memory interfaces 456 can be implemented as a Quad-Serial Peripheral Interface (QSPI) configured for 4-bit communication, a parallel 8-bit NOR/SRAM type of interface, a NAND interface configured for 8-bit and/or or 16-bit communication, etc.

It should be appreciated that the particular types of I/O peripherals 454 and flash memory interfaces 456 described within this specification are provided for purposes of illustration and not limitation. Other I/O peripherals and/or interfaces types having various bit widths can be used. Further, the number of I/O peripherals 454 and flash memory interfaces 456 is for purposes of illustration. Fewer or more I/O peripherals 454 and/or flash memory interfaces 456 can be used.

As shown, each of I/O peripherals 454 and flash memory interfaces 456 can be coupled to an I/O multiplexer (pictured as "I/O Mux") 458. I/O multiplexer 458 provides a plurality of outputs that can be directly routed or coupled to external pins of the particular IC in which the processor system is implemented. For example, a plurality of I/O pins of the IC, e.g., 53 pins, can be shared among selected ones of interfaces 454A-454G and/or selected ones of flash memory interfaces 456A-456C. A user can configure I/O multiplexer 458 to select which of I/O peripherals 454 and/or flash memory interfaces 456 are to be used and, therefore, coupled to I/O pins of the SOC via I/O multiplexer 458.

Signals that couple I/O peripherals 454 and flash memory interfaces 456 to I/O multiplexer 458 also can be coupled to the programmable circuitry via an interface 460. Any one of I/O peripherals 454A-454G and/or flash memory devices 456A-456C can be coupled to the programmable circuitry via interface 460. For example, interface 460 can include a configurable switch for each signal line coupled thereto allowing the signal line to be selectively coupled to the programmable circuitry depending upon the state of that switch. Interface 460, and the switches included therein, can be configured as part of the processor system.

In one aspect, one or more values stored in general settings 462 determine which signals pass from I/O peripherals 454 and/or flash memory interfaces 456 to the programmable circuitry. This allows data being communicated from any one of I/O peripherals 454 and/or flash memory interfaces 456 to be routed to circuitry within the programmable circuitry for further processing and/or monitoring. Data received via one or more of the I/O pins coupled to I/O peripherals 454 and/or flash memory interfaces 456 can be routed to the programmable circuitry for further processing through one or more of interfaces 446, 448, 450, and/or 452.

Interface 460 allows data that is output from I/O peripherals 454 and/or flash memory devices 456 to be provided to one or more of the I/O pins, to selected circuits implemented within the programmable circuitry, or to both I/O pin(s) concurrently with selected circuits implemented within the programmable circuitry. It should be appreciated that to couple to interface 460, circuits implemented within the programmable circuitry must be configured to do so through the loading of configuration data to form or implement the physical circuitry therein.

In another example, each of I/O peripherals 454 can be configured to generate an interrupt signal to interrupt controller 410. Because interrupt controller 410 is also connected to the programmable circuitry, interrupts generated by any of I/O peripherals 454 can be provided to CPU 454 and/or to the programmable circuitry, thereby facilitating use of I/O peripherals 454 by either the programmable circuitry and/or CPU 404. The interrupt indicator of interrupt indicators 438 for a particular I/O peripheral 454 assigned thereto can be visually modified to indicate the state of the interrupt as being used as described with reference to the programmable circuitry.

General settings block 462 is configurable to control various aspects of the processor system. One or more commands or values can be written to general settings block 462 to control or regulate operation of the processor system. General settings block 462 can control or regulate functions such as controlling IP enable resets, setting clock frequencies generated by clock generation unit 434, specifying I/O drive strength, the state of interface 460 in terms of which signals are routed through to the programmable circuitry, and other system level functions. General settings block 462 can regulate additional functions such as powering down the processor system, powering down or deactivating particular interfaces of the processor system independently, or the like.

As shown, the processor system further can include one or more interfaces 446, 448, 450, and 452 that connect the processor system to the programmable circuitry. In one exemplary implementation, one or more or all of interfaces 446-452 are implemented in accordance with the AMBA AXI Protocol Specification (AXI) as published by ARM. For instance, each of interfaces 446-452 can be implemented in conformance with the AMBA AXI Protocol Specification v. 3.0, which is incorporated herein by reference in its entirety. In general, AXI is a high performance, high frequency interface that is suitable for submicron interconnect.

In illustration, interfaces 446 and 448 each can be implemented to provide two, 32-bit channels that couple the programmable circuitry with central interconnect 444. Interface 446 can be implemented as a general-purpose master interface. Interface 446, for example, can be used to perform general purpose transfers of data from the processor system and/or DMA interface 428 to the programmable circuitry. Interface 448 can be implemented as a general-purpose slave interface. For example, interface 448 can be used to perform general purpose data transfer between the processor system and the programmable circuitry.

Through interfaces 446 and/or 448 and central interconnect 444, circuits implemented within the programmable circuitry can access various ones of I/O peripherals 454. Through interfaces 446 and/or 448, in combination with central interconnect 444, circuits within the programmable circuitry further can access OCM 416 (using OCM interconnect 418) directly and off-chip memory through memory interface 436.

Interface 450 can be implemented as a 64-bit slave interface that couples the programmable circuitry with CPU 404. Through interface 450, using SCU 412, for example, circuits implemented within the programmable circuitry are provided with direct access to the L1 cache within each of cores 406 and 408, interrupt controller 410, L2 cache 414, and OCM 416. Accordingly, circuits within the programmable circuitry can read and/or write to such memories and detect interrupts generated or asserted within CPU 404. For example, interface 450 can provide coherent access to CPU 404 that is suitable for use by circuits functioning as co-processors. In illustration, a soft processor implemented within the programmable circuitry in the form of user specified circuitry can communicate with the processor system via interface 450.

The programmable circuitry is configurable to directly detect interrupts from I/O peripherals 454, or to detect interrupts from interrupt controller 410. It should be appreciated that interrupt controller 410 allows the programmable circuitry to detect processor-specific or processor-generated interrupts that originate within CPU 404.

Interface 452 can be implemented to provide a plurality, e.g., four, 64-bit slave interfaces. Interface 452 can be used to exchange large amounts of data between the processor system and circuits implemented within the programmable circuitry efficiently. Interface 452 provides circuits implemented within the programmable circuitry with access to OCM 418 and memory interface 436 via programmable circuitry to PCMI 442.

In addition, the processor system can include an ADC 464 that is configurable. DAP 470 is a Debug Access Port to CoreSight Components 430, which include a co-debug processor in hardware. DAP 470 is used as part of the trace and debugging functionality. DEVC 472 is a Device Configuration Block used to configure the processor system and the programmable circuitry.

The various blocks described with reference to FIG. 4 are independently selectable to configure the block for operation within the processor system. In one aspect, the blocks of the processor system that are configurable can be visually distinguished from those blocks of the processor system that are not configurable via the CAD tool. Further, the appearance of a block can be modified to indicate the status of the block in terms of configuration, whether the block is active or inactive within the user design being created, or the like. Exemplary techniques for visually distinguishing a block from another block include, but are not limited to, coloring a block differently than another block having a different status, applying outlining, shadowing or another visual effect not applied to another block having a different status, etc.

In one example, Scalar Vector Graphics (SVG) technology can be used to implement visualization 402 and other views and/or windows of the UI. SVG provides functionality such as interactive enablement/disablement, coloring, visibility of blocks, I/Os, interfaces, and the like. It should be appreciated that the UI can be implemented using any of a variety of available programming technologies. As such, the examples provided within this specification are intended to be illustrative rather than limiting.

FIGS. 5-10 illustrate additional views of the UI that are displayed to a user responsive to a selection of a block, or blocks, from visualization 402 of FIG. 4. Blocks can be selected by double clicking using a pointer, selecting the block and pressing the "enter" or "return" key, or any of a variety of other known methods of selecting a graphical object displayed on a display within a computing system.

FIG. 5 is a fifth block diagram illustrating another example of a view 500 for the UI. View 500 is displayed responsive to selection of memory interface 436. View 500 includes a plurality of different regions including regions 502, 504, 506, 508, and 510. Each of regions 502-510 includes one or more controls through which a user can provide a user input to specify a value for a configuration parameter of the processor system and, more particularly, for memory interface 436. A control is a UI element for receiving a user input specifying a value that is assigned to a configuration parameter.

For purposes of illustration and description, the term "control," in reference to a UI element, is used interchangeably with the phrase "configuration parameter" from time-to-time within this specification when describing operation of views of the UI. Further, the phrase "configuration parameter" is used interchangeably with a "value of a configuration parameter" from time-to-time within this specification when describing operation of views of the UI.

Region 502 includes a control for enabling or disabling memory interface 436 within a user specified design involving the processor system. The appearance of memory interface 436, as presented within visualization 402, is changed responsive to whether memory interface 436 is enabled (e.g., checked) or disabled (e.g., unchecked) as specified by the state of the control within region 502.

Region 504 includes a plurality of controls for configuration parameters relating to DDR controller configuration. Memory interface 436, for example, can communicate with any of a variety of different memory types and widths as specified within region 504. Region 506 includes a plurality of controls for configuration parameters relating to the circuit board upon which the SOC in which the processor system is implemented are specified. Within region 506, the user can selectively enable training parameters such as write leveling, read gate, and/or read data eye. Configuration parameters relating to the DQS to clock delay can be specified as well as the board delay.

Region 508 includes a plurality of controls for configuration parameters relating to memory port configuration. Region 510 includes a configuration parameter for additive latency. Through the configuration parameter of region 510, a value for additive latency can be specified by a user.

In one example, responsive to a user selecting a particular value for a configuration parameter, a default value for one or more other configuration parameters is selected. The default values can be automatically populated into the relevant or corresponding control(s). For example, responsive to a user selecting a particular memory type, one or more default values are populated into one or more of the controls within view 500. The default values can be recalled from a profile stored in association with the selected memory type.

Figure 6:
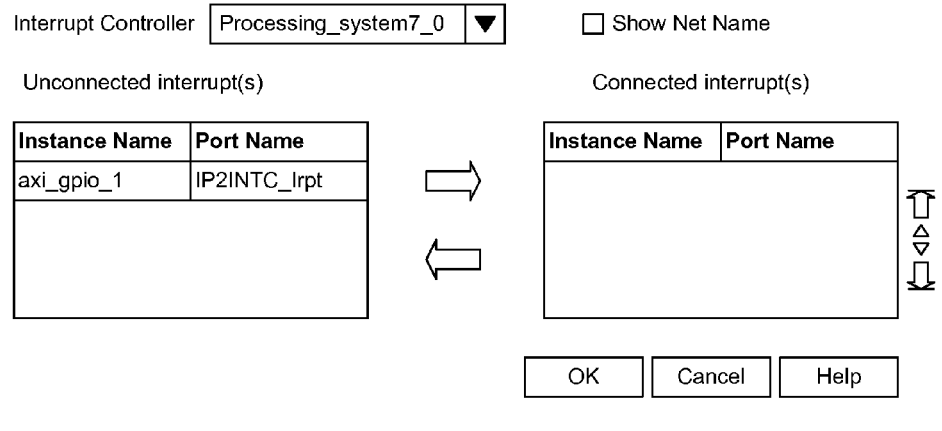
FIG. 6 is a sixth block diagram illustrating another example of a view for the UI.

FIG. 6 is a sixth block diagram illustrating another example of a view 600 for the UI. View 600 is displayed responsive to selection of interrupt controller 410. Through view 600, a user is able to select which ones of the I/O peripherals 454 are to be connected to interrupt controller 410 (and, as such CPU 404). Through view 600, a user is also able to connect the programmable circuitry to interrupt controller 410. In each case, the user is able to designate the particular interrupt that is connected to the designated component.

In one aspect, the appearance of interrupt controller 410 within FIG. 4 is changed according to whether any interrupts have been connected through view 600. In addition, the particular ones of the interrupt indicators of FIG. 4 that are connected through view 600 can be highlighted as illustrated by interrupt indicators 438. As shown in FIG. 4, interrupt 1 has been connected and is in use, e.g., per the user inputs provided through view 600.

Figure 7:
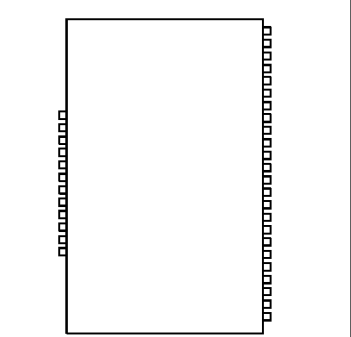
FIG. 7 is a seventh block diagram illustrating another example of a view for the UI.

FIG. 7 is a seventh block diagram illustrating another example of a view 700 for the UI. View 700 is displayed responsive to selection of any one of interfaces 446, 448, 450, and/or 452. View 700 further can be displayed responsive to a selection of central interconnect 444. Through view 700, the connectivity of each of interfaces 446-452 to various other blocks within the processor system through central interconnect 444 can be specified. Further, any of the available configuration parameters of interfaces 446-452 can be specified.

FIG. 8 is an eighth block diagram illustrating another example of a view 800 for the UI. View 800 is displayed responsive to selection of I/O peripherals 454, flash memory interfaces 456, or I/O mux 458. I/O peripherals 454 (e.g., the encompassing block of the individual I/O peripherals) or any of the individual peripherals 454A-454G can be selected to cause view 800 to be displayed. Similarly, flash memory interface 456 in general or any of the individual flash memory interfaces 456A-456C can be selected to cause view 800 to be displayed.

Through view 800, within region 805, a user can enable individual ones of peripherals 454A-454G and/or individual ones of flash memory interfaces 456A-456G. When a particular one of the peripherals 454A-454G is enabled by selection of the corresponding check box control, the appearance of the corresponding I/O peripheral within visualization 402 is changed to indicate the active state. Similarly, when a particular one of flash memory interfaces 456A-456C is enabled by selection of the corresponding check box control, the appearance of the corresponding flash memory interface within visualization 402 is changed to indicate the active state.

In region 810, the user can configure I/O mux 458. More particularly, through region 810, the user can assign particular pins of I/O mux 458 to each of the peripherals and/or flash memory interfaces enabled in region 805. In one aspect, the appearance of each of the peripherals 454A-454G and/or flash memory interfaces 456A-456C can be set to indicate whether the particular component has been enabled, the appearance can be set differently to indicate that the component has been properly configured, e.g., connected to the I/O mux 458.

FIG. 9 is a ninth block diagram illustrating another example of a view 900 for the UI. View 900 is displayed responsive to selection of clock generation block 434. Through view 900, a user is able to select one of a plurality of different phase-locked loops (PLLs) or an external clock signal for clocking the processor system. Since clock generation block 434 further generates four different clock signals according to the examples presented within this specification, the four different clock signals can be configured. Accordingly, through view 900, the particular clock signal for one or more of the components of the processor system, e.g., different ones of I/O peripherals 454 and/or flash memory interfaces 456, and for the programmable circuitry can be selected.

When a particular one of the four clock signals is assigned to one or more different components, whether within the processor system or the programmable circuitry, the appearance of the corresponding one of the indicators labeled 0-3 beneath clock generation block 434 in visualization 402 can be changed to indicate such use. Further, the appearance of clock generation block 434 can be changed to indicate that the unit has not been configured or has been configured, e.g., at least one clock signal has been configured for use.

In another example, a different view can be presented that illustrates the connectivity of peripherals 454 and flash memory interfaces 456 with available pins of the IC through I/O mux 458 in tabular form. For instance, the tabular view can provide a flat view of all devices using available pins of I/O mux 458. The tabular view can be color coded to indicate status of the various pins, peripherals, and/or interfaces shown.

Figure 10:
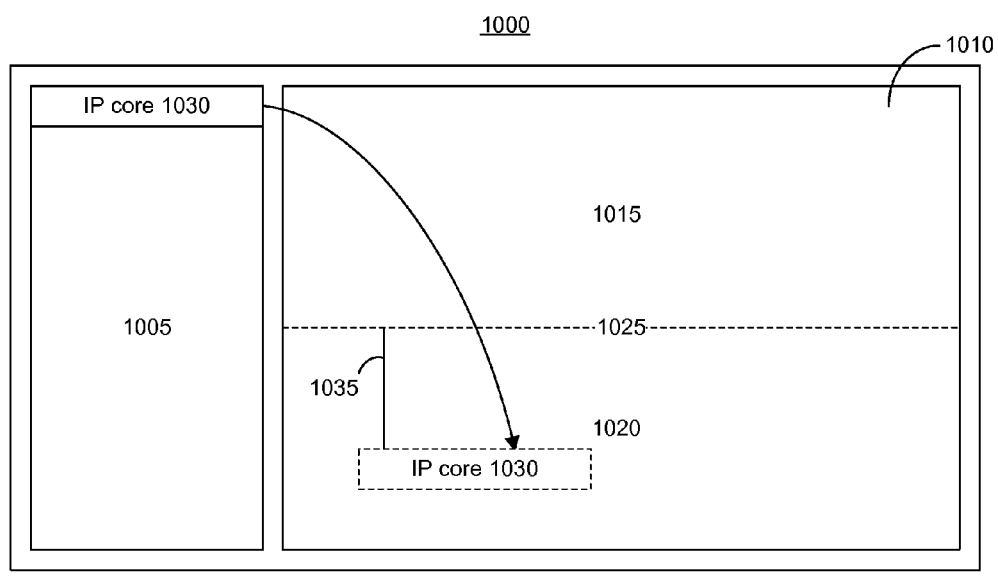
FIG. 10 is a tenth block diagram illustrating another example of a view for the UI.

FIG. 10 is a tenth block diagram illustrating another example of a view 1000 of a UI. View 1000 is generated by system 100 and, as such, is displayed upon display 135. As pictured, view 1000 includes regions 1005 and 1010. In the example shown in FIG. 10, region 1010 is subdivided by dividing line 1025 into two regions (e.g., sub-regions) 1015 and 1020. Region 1005 is provided as an IP library. Region 1010 is a working area in which the processor system and the programmable circuitry regions of the SOC are represented. Within region 1015, visualization 402 of the processor system is displayed as an interactive portion of view 1000. Region 1020 represents the programmable circuitry region of the SOC. As previously noted, in one exemplary implementation, the programmable circuitry region of the SOC is implemented as an FPGA or includes one or more programmable circuit blocks of an FPGA.

FIG. 10 illustrates that a user can select an IP core from the IP library. In this example, the user has selected IP core 1030. The user has dragged and dropped IP core 1030 into region 1020 representing the programmable circuitry portion of the SOC. In one aspect, system 100 can generate a connection 1035 between IP core 1030 and the processor system automatically responsive to the user input placing IP core 1030 into region 1020. In another example, the user can drop IP core 1030 onto one of the available interfaces of the processor system, which locates IP core 1030 in region 1020 and causes system 100 to automatically generate connection 1035 between IP core 1030 and the particular block, i.e., one of interfaces 446-452 or 460, upon which IP core 1030 was dropped.

Accordingly, within region 1020, a visualization of one or more or all portions of the programmable circuitry, e.g., an FPGA or portion thereof, is displayed concurrently with the visualization of the processor system. The appearance of the visualization of the programmable circuitry portion of the SOC is modified responsive to one or more received user inputs. In this example, the modified appearance of the visualization reflects user specified circuitry that is to be implemented within the programmable circuitry of the SOC and the connection, e.g., established communication links implemented within the programmable circuitry, of the user specified circuitry to the processor system.

Figure 11:
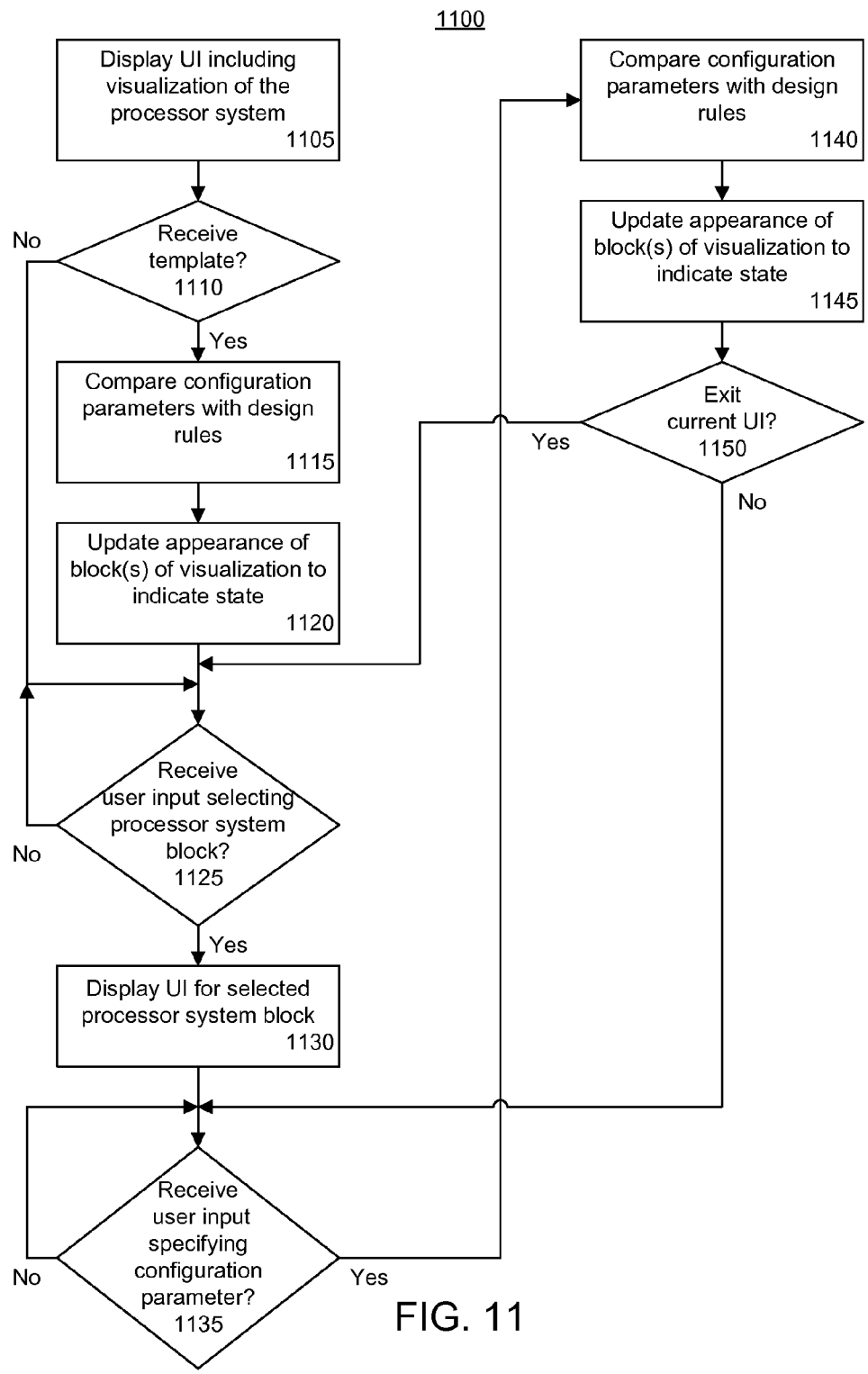
FIG. 11 is a flow chart illustrating an exemplary method of computer-aided design for an SOC.

FIG. 11 is a flow chart illustrating an exemplary method 1100 of CAD for an SOC. Method 1100 is implemented by a system such as system 100 as described with reference to FIGS. 1-10 of this specification. Method 1100 can begin in a state where the system is a CAD tool, e.g., is executing a CAD application as described.

In block 1105, the system displays a UI for configuring the SOC or at least the processor system of the SOC. The UI can include a view having a visualization of the processor system. As discussed, the visualization presented within, or as part of, the UI is dynamic in that the state of various blocks of the processor system is illustrated within the visualization in real time as the user configures the processor system using the UI.

In block 1110, the system can determine whether a template has been received. If so, method 1100 continues to block 1115. If not, method 1100 continues to block 1125. In block 1110, the system determines whether the user has provided an input that specifies a template for the processor system of the SOC. A template for the processor system can include one or more configuration parameters for one or more of the various blocks of the processor system as described within this specification. Accordingly, a template, when loaded, can specify a complete configuration for one block, for more than one block, or for all blocks of the processor system. Similarly, a template can specify a partial configuration for one block, for more than one block, or for all blocks of the processor system. The template further can specify a mix of partial and complete configurations for two or more blocks of the processor system.

In block 1115, the system compares the configuration parameter(s) specified in the received template with one or more defined design rules stored within the system. A design rule specifies allowable values for configuration parameters of the processor system and/or the SOC. In one aspect, the comparison is performed responsive to receiving the template in block 1110. In this manner, violations of design rules can be identified immediately in real time rather than during a post-processing phase of the design. As such, substantial re-working of the design can be avoided.

In block 1120, the system updates the appearance of one or more blocks of the visualization to indicate state. As discussed, the appearance of one or more or all of the blocks of the processor system can be updated and/or changed to indicate the current state of the block. The current state of the block is defined by the particular values of the configuration parameters specified for each respective block. As such, enabled blocks can be visually distinguished from disabled blocks. A fully configured block without any design rule violations can be visually distinguished from a fully configured block with a design rule violation. Similarly, a partially configured block can be visually distinguished from one that is not enabled, fully configured, and one with a design rule violation whether partially configured or fully configured. It should be appreciated that each of the various conditions or states of a block described within this specification can be visually indicated independently of the others, in a distinctive way, and in any combination as is applicable per the specified configuration parameter(s) for the block.

In block 1125, the system can determine whether a user input has been received that selects a particular block of the processor system from the visualization. If so, method 1100 continues to block 1130. If not, method 1100 loops back to block 1125 to continue monitoring for a user input selecting a block of the processor system. In block 1130, responsive to the input received in block 1125, the system displays the particular view of the UI for the selected block. For example, responsive to selecting a block from visualization 402, a further interface corresponding to the selected block as described with reference to FIGS. 5-9 is displayed.

In block 1135, the system determines whether a user input specifying a value for a configuration parameter for the selected block has been received. If so, method 1100 continues to block 1140. If not, method 1100 loops back to block 1135 to continue monitoring for a user input selecting a block of the processor system. In block 1140, the system compares the value for the configuration parameter from the user input with a design rule for the selected block. In another aspect, each view that is presented can limit the available or selectable options presented to the user so that only those values for configuration parameters that do not violate established design rules are available. In this manner, the comparing that is described need not be performed. Rather, a filtering of available options or selections can be performed that limits configuration parameter values to only those that do not violate the design rules.

In block 1145, the system updates the appearance of the selected block to indicate state. The appearance of the selected block is updated according to the received configuration parameter or configuration parameters. As discussed, the state can be indicated as "configured" or "partially configured." Further, the appearance of the block is updated to indicate whether the values for the configuration parameters of the block violate any design rules.

In block 1150, the system can determine whether the user, e.g., based upon any received user inputs, wishes to exit the current view that is displayed. If so, method 1100 loops back to block 1125 to continue processing. If not, method 1100 loops back to block 1135 to continue receiving user inputs through the current view.

FIG. 11 is presented for purposes of example only to better illustrate the dynamic nature of the visualization. It should be appreciated that other aspects of the system such as error handling and the like are not illustrated. When a user completes the design process, the system can utilize the values of the configuration parameters for the processor system and incorporate the configuration parameters into configuration data such as a bitstream that is loaded into the SOC. Once loaded, the processor system is configured to operate in accordance with the system design specified by the user while working through the CAD system. The bitstream further can specify any user-specified circuit designs that are to be implemented within the programmable circuitry that may or may not operate cooperatively with the processor system of the SOC.

For purposes of explanation, specific nomenclature is set forth to provide a thorough understanding of the various inventive concepts disclosed herein. The terminology used herein, however, is for the purpose of describing particular exemplary implementations only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects disclosed within this specification can be realized in hardware or a combination of hardware and software. One or more aspects can be realized in a centralized fashion in one system or in a distributed fashion where different elements are spread across several interconnected systems. Any kind of data processing system or other apparatus adapted for carrying out at least a portion of the methods described herein is suited.

One or more aspects further can be embedded in a device such as a computer program product, which includes all the features enabling the implementation of the methods described herein. The device can include a data storage medium, e.g., a non-transitory computer-usable or computer-readable medium, storing program code that, when loaded and executed in a system including a processor, causes the system to initiate and/or perform at least a portion of the functions or operations described within this specification. Examples of data storage media can include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various embodiments of the one or more embodiments disclosed herein. In this regard, each block in the flowchart or block diagrams may represent a module, segment, or portion of code, which includes one or more executable instructions for implementing the specified logical function(s). It should also be noted that, in some alternative implementations, the functions noted in the blocks may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terms "computer program," "software," "application," "computer-usable program code," "program code," "executable code," variants and/or combinations thereof, in the present context, mean any expression, in any language, code or notation, of a set of instructions intended to cause a data processing system perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

Thus, throughout this specification, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

One or more aspects disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A user interface for a computer-aided design tool, the user interface comprising:
   a display comprising a visualization of a processor system of a system-on-a-chip (SOC);
   wherein the visualization comprises a plurality of blocks and said each block represents a component of the processor system; and
   wherein said each block visually indicates a configuration status of the component represented by said each block.

2. The user interface of claim 1, wherein an appearance of a selected block of the plurality of blocks is updated responsive to a user input specifying a value of a configuration parameter of the selected block.

3. The user interface of claim 1, wherein the visualization further comprises a further block representing an input/output of the SOC shown concurrently with the plurality of blocks.

4. The user interface of claim 3, wherein the further block visually indicates a configuration status of the input/output of the SOC.

5. The user interface of claim 1, wherein an appearance of a selected block of the plurality of blocks indicates a result of a design rule check performed for the selected block; and
   wherein the design rule check is performed responsive to receiving a user input specifying a value of a configuration parameter for the selected block.

6. The user interface of claim 1, wherein the display further comprises a visualization of at least a portion of a field programmable gate array coupled to the visualization of the processor system; and
   wherein an appearance of the visualization of the at least a portion of the field programmable gate array is modified responsive to a user input.

7. The user interface of claim 1, wherein an appearance of a selected block of the plurality of blocks indicates whether the selected block is enabled for a current design for the SOC.

8. The user interface of claim 1, wherein a plurality of values are assigned to configuration parameters for at least one of the plurality of blocks responsive to a user input selecting a template for the SOC.

9. A method of computer-aided design, the method comprising:
   displaying, upon a display, a visualization of a processor system of a system-on-a-chip (SOC);
   wherein the visualization comprises a plurality of blocks and each block represents a component of the processor system;
   receiving a user input specifying a configuration parameter for a block selected from the plurality of blocks; and
   visually indicating, using a processor and the display, a configuration status of the selected block responsive to the user input.

10. The method of claim 9, further comprising:
    displaying, upon the display, a further block representing an input/output of the SOC;
    wherein the further block is displayed concurrently with the plurality of blocks.

11. The method of claim 10, wherein the further block visually indicates a configuration status of the input/output.

12. The method of claim 9, further comprising:
    responsive to the user input, performing a design rule check for the selected block; and
    updating an appearance of the selected block to indicate a result of the design rule check.

13. The method of claim 9, further comprising:
    displaying, upon the display concurrently with the visualization of the processor system, a visualization of at least a portion of a field programmable gate array coupled to the visualization of the processor system; and
    modifying an appearance of the visualization of the at least a portion of the field programmable gate array responsive to a further user input.

14. The method of claim 9, wherein the configuration status indicates whether the selected block is enabled for a current design of the SOC.

15. A non-transitory computer-readable storage medium having instructions which, when executed by a processor, perform a method comprising:
    displaying, upon a display, a visualization of a processor system of a system-on-a-chip (SOC);
    wherein the visualization comprises a plurality of blocks and each block represents a component of the processor system;
    receiving a user input specifying a configuration parameter for a block selected from the plurality of blocks; and
    visually indicating a configuration status of the selected block responsive to the user input.

16. The computer readable storage medium of claim 15, wherein the method further comprises:
    displaying, upon the display, a further block representing an input/output of the SOC;
    wherein the further block is displayed concurrently with the plurality of blocks.

17. The computer readable storage medium of claim 16, wherein the further block visually indicates a configuration status of the input/output.

18. The computer readable storage medium of claim 15, wherein the method further comprises:
    responsive to the user input, performing a design rule check for the selected block; and
    updating an appearance of the block to indicate a result of the design rule check.

19. The computer readable storage medium of claim 15, wherein the method further comprises:
    displaying, upon the display concurrently with the visualization of the processor system, a visualization of at least a portion of a field programmable gate array coupled to the visualization of the processor system; and modifying an appearance of the visualization of the at least a portion of the field programmable gate array responsive to a further user input.

20. The computer readable storage medium of claim 15, wherein the configuration status indicates whether the selected block is enabled for a current design of the SOC.

* * * * *